(12) United States Patent
Lee et al.

(10) Patent No.: US 9,377,681 B2
(45) Date of Patent: Jun. 28, 2016

(54) MASK MANUFACTURING APPARATUS AND METHOD OF MANUFACTURING MASK USING LASER BEAM

(71) Applicant: Samsung Display Co., Ltd., Yongin, Gyeonggi-Do (KR)

(72) Inventors: Doh-Hyoung Lee, Guri-si (KR); Jun Ho Jo, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 296 days.

(21) Appl. No.: 14/021,489

(22) Filed: Sep. 9, 2013

(65) Prior Publication Data

US 2014/0217646 A1 Aug. 7, 2014

(30) Foreign Application Priority Data

Feb. 1, 2013 (KR) .......................... 10-2013-0011956

(51) Int. Cl.
| | | |
|---|---|---|
| *B23K 26/00* | (2014.01) | |
| *B23K 26/16* | (2006.01) | |
| *G03F 1/76* | (2012.01) | |
| *G03F 7/20* | (2006.01) | |
| *B23K 26/067* | (2006.01) | |

(52) U.S. Cl.
CPC ................ *G03F 1/76* (2013.01); *G03F 7/2053* (2013.01); *G03F 7/70875* (2013.01); *B23K 26/067* (2013.01)

(58) Field of Classification Search
CPC ..... G03F 1/76; G03F 7/2053; G03F 7/70875; B23K 26/00–26/0087; B23K 26/0652; B23K 26/067–26/0676; B23K 26/0807; B23K 26/0853; B23K 26/127; B23K 26/365; B23K 26/423
USPC .................... 219/121.6–121.83; 118/720, 721
See application file for complete search history.

(56) References Cited

U.S. PATENT DOCUMENTS

| | | | | |
|---|---|---|---|---|
| 6,475,287 | B1 * | 11/2002 | Clark ........................... | 118/721 |
| 6,589,382 | B2 * | 7/2003 | Clark et al. ................ | 156/304.3 |
| 7,976,633 | B2 * | 7/2011 | Yotsuya et al. ............... | 118/721 |
| 2003/0102291 | A1 | 6/2003 | Liu et al. | |
| 2003/0224109 | A1 * | 12/2003 | Kang et al. ..................... | 427/282 |
| 2006/0000816 | A1 | 1/2006 | Hogan | |
| 2008/0188156 | A1 * | 8/2008 | Buchhauser et al. ........... | 445/22 |

FOREIGN PATENT DOCUMENTS

| | | | |
|---|---|---|---|
| EP | | 1145797 A2 | 10/2001 |
| EP | | 1063048 B1 | 9/2004 |
| KR | 10-2006-0055939 A | | 5/2006 |
| KR | | 10-0687486 B1 | 3/2007 |
| KR | 10-2008-0006998 A | | 1/2008 |
| KR | | 10-1023396 B1 | 3/2011 |
| WO | | 2011/116968 A2 | 9/2011 |

\* cited by examiner

*Primary Examiner* — Sang Y Paik
(74) *Attorney, Agent, or Firm* — Knobbe Martens Olson & Bear LLP (57) ABSTRACT

A mask manufacturing apparatus includes a laser irradiator, a stage, a frame, and a heat spreader sheet. The laser irradiator divides a laser beam into a plurality of sub-laser beams and irradiates the sub-laser beams to a shadow mask material which is placed over a stage. The frame is disposed over the stage to support the shadow mask material. The heat spreader sheet makes contact with the shadow mask material, absorbs heat generated from the shadow mask material, and dissipates the heat to surroundings of the shadow mask material. Accordingly, the shadow mask material is protected from overheating.

10 Claims, 7 Drawing Sheets

MASK MANUFACTURING APPARATUS AND METHOD OF MANUFACTURING MASK USING LASER BEAM

CROSS-REFERENCE TO RELATED APPLICATION

This U.S. non-provisional patent application claims priority under 35 U.S.C. §119 of Korean Patent Application No. 10-2013-0011956, filed on Feb. 1, 2013, the contents of which are hereby incorporated by reference in its entirety.

BACKGROUND

1. Field of Disclosure

The present disclosure relates to an apparatus of manufacturing a mask and a method of manufacturing the mask using a laser beam. More particularly, the present disclosure relates to an apparatus of manufacturing a shadow mask used to deposit an organic material and a method of manufacturing the shadow mask.

2. Discussion of the Related Technology

In general, a deposition process is performed to deposit an organic material on a substrate using a shadow mask when an organic light emitting display device is manufactured. The shadow mask includes a specific pattern, and thus the organic material is deposited only in an area other than an area covered by the shadow mask.

The shadow mask is manufactured by using a wet etch process or a laser beam process. In the case of the wet etching process, the pattern is difficult to be exquisitely formed due to non-uniformity of the etching process. The shadow mask can be manufactured using the laser beam process or laser ablation process.

SUMMARY

The present disclosure provides an apparatus of manufacturing a mask, which is capable of effectively discharging heat generated when a pattern is formed on a shadow mask using a laser beam.

The present disclosure provides a method of manufacturing the mask using a laser beam to effectively discharge or dissipate heat generated from the shadow mask.

Embodiments of the inventive concept provide a mask manufacturing apparatus including a laser irradiation part, a stage, a frame, and a heat discharge sheet or heat spreader sheet.

The laser irradiation part or laser irradiator includes a laser generation part, a diffractive optical element (DOE) lens, an optical system, and a scanner. The laser generation part generates the laser beam. The DOE lens divides the laser beam into the sub-laser beams. The optical system reduces an aberration between the sub-laser beams. The scanner condenses or concentrates the sub-laser beams to irradiate the sub-laser beams onto the shadow mask.

The shadow mask material is placed on a stage. The frame is disposed on the stage to support the shadow mask material. The heat discharge sheet makes contact with the shadow mask material and absorbs a heat generated from the shadow mask material to discharge or dissipate the heat to surroundings of the shadow mask material.

The mask manufacturing apparatus further includes a magnetic material accommodated in the frame and disposed to face the shadow mask while interposing the heat discharge sheet therebetween.

The mask manufacturing apparatus further includes a heat-discharge sheet lift or transfer mechanism connected to the heat discharge sheet to move the heat discharge sheet to a vertical direction.

Embodiments of the inventive concept provide a mask manufacturing apparatus including a laser irradiation part, a stage, a frame, a heat discharge sheet, and a heat transfer medium. The heat transfer medium is disposed between the shadow mask material and the heat discharge sheet to make contact with the shadow mask material and the heat discharge sheet.

Embodiments of the inventive concept provide a method of manufacturing a mask including placing a shadow mask material to be supported by a frame, making direct or indirect heat conduction between the shadow mask material and a heat discharge sheet, forming a pattern on the shadow mask using a laser beam, and discharging or spreading a heat generated from the shadow mask through the heat discharge sheet.

According to the above, the heat discharge sheet absorbs the heat generated from the shadow mask and discharges the absorbed heat to the surroundings of the shadow mask, thereby preventing or inhibiting the shadow mask from being overheated. In addition, the intensity of the sub-laser beams irradiated onto the shadow mask may be enhanced, and thus a time required to form the pattern on the shadow mask may be shortened.

Further, since the shadow mask is manufactured by the above-mentioned method, the shadow mask may be protected from overheating.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in detail with reference to the accompanying drawings.

When the shadow mask is manufactured using the laser beam process, heat is generated from an object onto which the laser beam is irradiated. In this case, the heat generated from the edge of the object is dissipated to surroundings of the object, but the heat generated from the center of the object is not easily dissipated. Accordingly, an overheating may occur in the center of the object, and the overheating causes defects, e.g., thermal deformation of the object.

Figure 1:
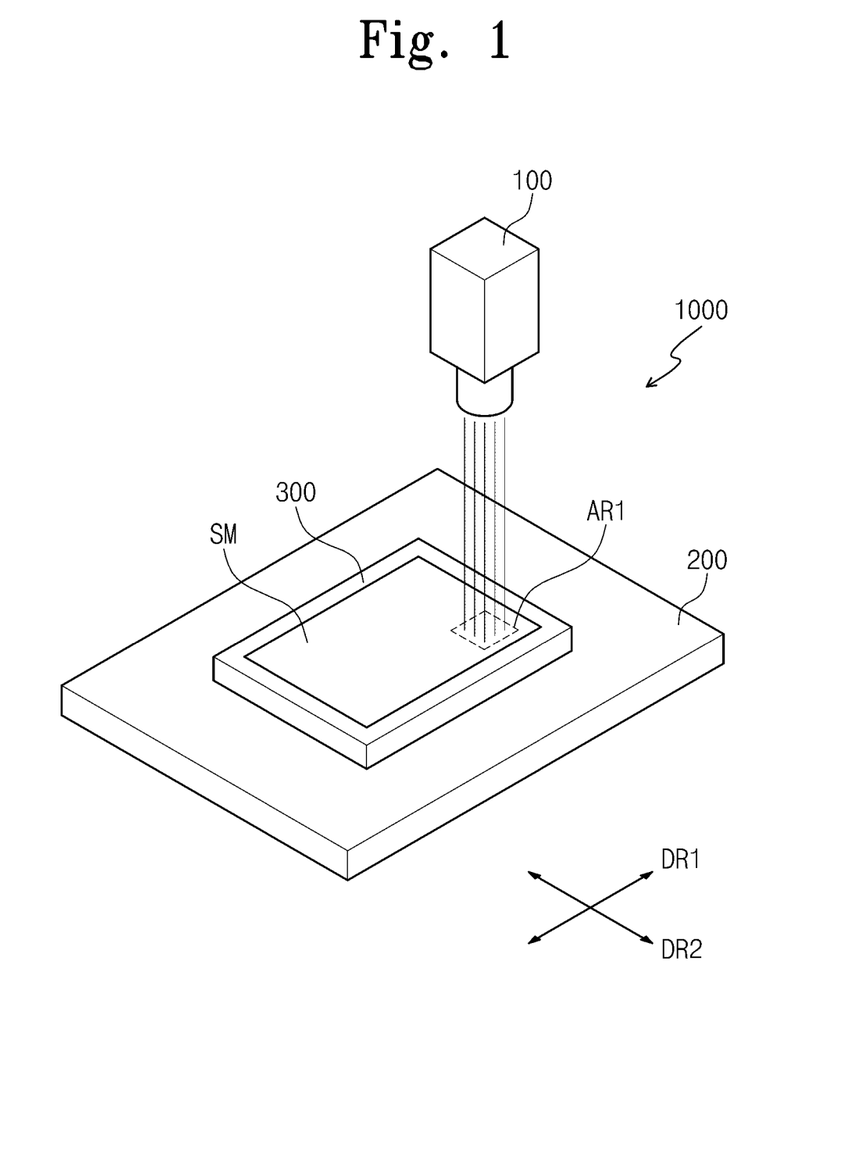
FIG. 1 is a perspective view showing a mask manufacturing apparatus according to an exemplary embodiment of the present disclosure.
Figure 2:
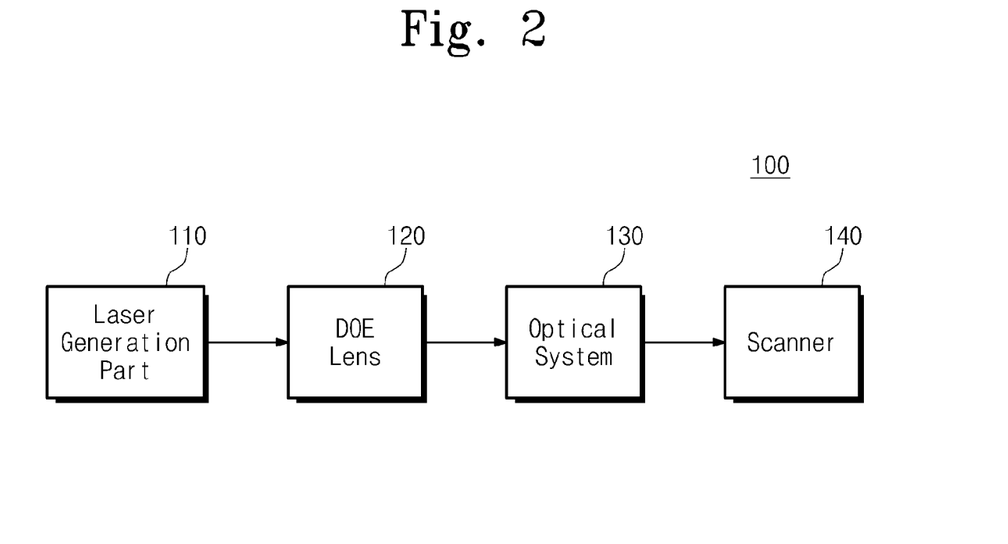
FIG. 2 is a block diagram showing a laser irradiation part shown in FIG. 1.
Figure 3:
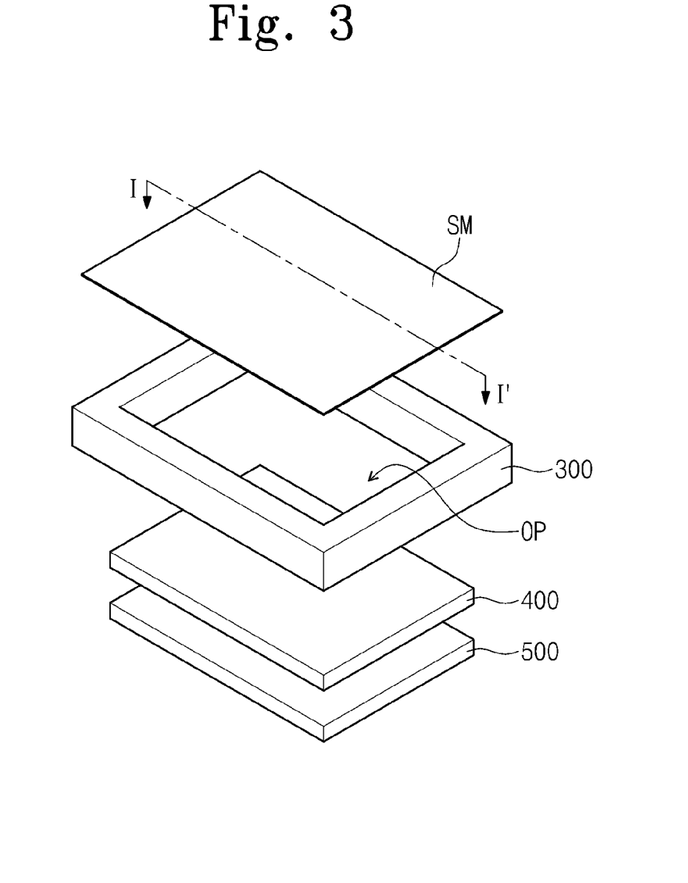
FIG. 3 is an exploded perspective view showing a shadow mask, a frame, a heat discharge sheet, and a magnetic material shown in FIG. 1.
Figure 4:
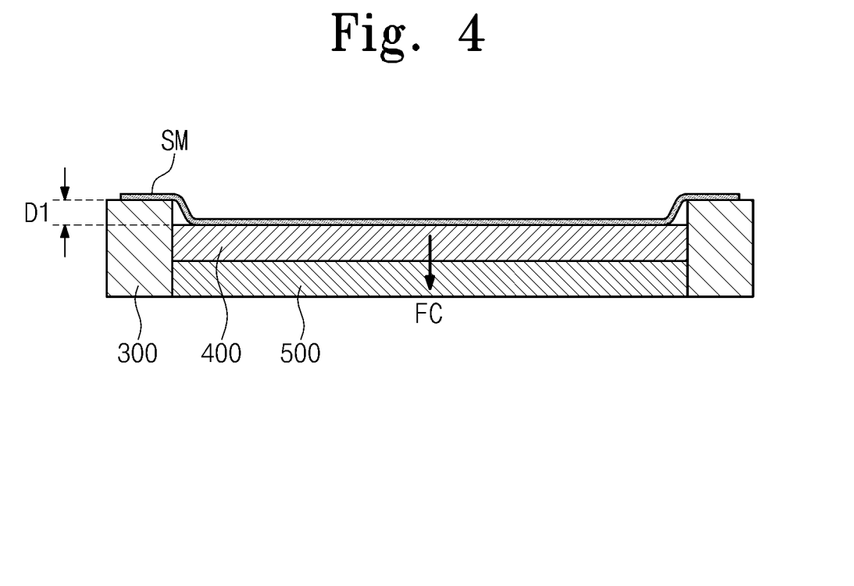
FIG. 4 is a cross-sectional view taken along a line I-I' of FIG. 3.

FIG. 1 is a perspective view showing a mask manufacturing apparatus according to an exemplary embodiment of the present disclosure, FIG. 2 is a block diagram showing a laser irradiation part shown in FIG. 1, FIG. 3 is an exploded perspective view showing a shadow mask, a frame, a heat discharge sheet, and a magnetic material shown in FIG. 1, and FIG. 4 is a cross-sectional view taken along a line I-I' of FIG. 3.

Referring to FIGS. 1 to 4, a mask manufacturing apparatus 1000 includes a laser irradiation part or laser irradiator 100, a stage 200, a frame 300, a heat discharge sheet or heat spreader sheet 400, and a magnetic material 500.

The laser irradiation part 100 includes a laser generation part or laser generator 110, a diffractive optical element (DOE) lens 120, an optical system 130, and a scanner 140.

The laser generation part 110 generates a laser beam with a predetermined intensity and a predetermined diameter.

The DOE lens 120 divides the laser beam emitted from the laser generation part 110 into a plurality of sub-laser beams. The DOE lens 120 includes a diffractive optical element to divide the laser beam into the sub-laser beams using a diffraction phenomenon of the laser beam. The sub-laser beams are formed in an N-by-M array configuration (each of "N" and "M" is a natural number).

The optical system 130 reduces an aberration between the sub-laser beams to improve a field curvature. The sub-laser beams passing through the optical system 130 are focused on a shadow mask SM that is flat.

The scanner 140 condenses or concentrates the sub-laser beams to allow the sub-laser beams to be vertically irradiated onto a processing area AR1 of the shadow mask SM. The scanner 140 may include a focusing lens, an f-theta lens, or an f-theta telecentric lens. In addition, the scanner 140 may be a galvano scanner.

The shadow mask SM is placed on the stage 200. Although not shown in the figures, the stage 200 moves to first and second directions DR1 and DR2 to align the shadow mask SM, so that the sub-laser beams are irradiated onto the processing area AR1 of the shadow mask SM.

The frame 300 is disposed on the stage 200 to support the shadow mask SM. The frame 300 is provided with an opening portion OP formed penetrating therethrough and includes four sidewalls. That is, the frame 300 has a rectangular ring shaped rim. The shadow mask SM is disposed on an upper surface of the frame 300, and the frame 300 holds and supports an edge of the shadow mask SM.

In the present exemplary embodiment, the shadow mask SM may be an alloy containing iron, nickel, and carbon, i.e., Invar. The shadow mask SM is patterned by the sub-laser beams and serves as a shadow mask to deposit an organic material. The shadow mask SM has a thickness equal to or smaller than about 100 micrometers to improve a precision degree thereof.

The heat discharge sheet 400 is disposed to correspond to the opening portion OP of the frame 300 when viewed in a plan view. The heat discharge sheet 400 is accommodated in the frame 300 such that a step difference occurs between the frame 300 and the heat discharge sheet 400. That is, a height difference exists between the upper surface of the heat discharge sheet 400 and the upper surface of the frame 300 by the step difference D1.

The heat discharge sheet 400 directly makes contact with the shadow mask SM. The heat discharge sheet 400 absorbs the heat generated from the processing area AR1 of the shadow mask SM during a laser ablation process and discharges the heat to the outside of the shadow mask SM, so that the processing area AR1 of the shadow mask SM may be protected from overheating. In addition, since the processing area AR1 of the shadow mask SM may be protected from overheating, the intensity of the sub-laser beams irradiated onto the shadow mask SM may be enhanced. As a result, a time required to form the pattern on the shadow mask SM may be shortened.

Figure 5:
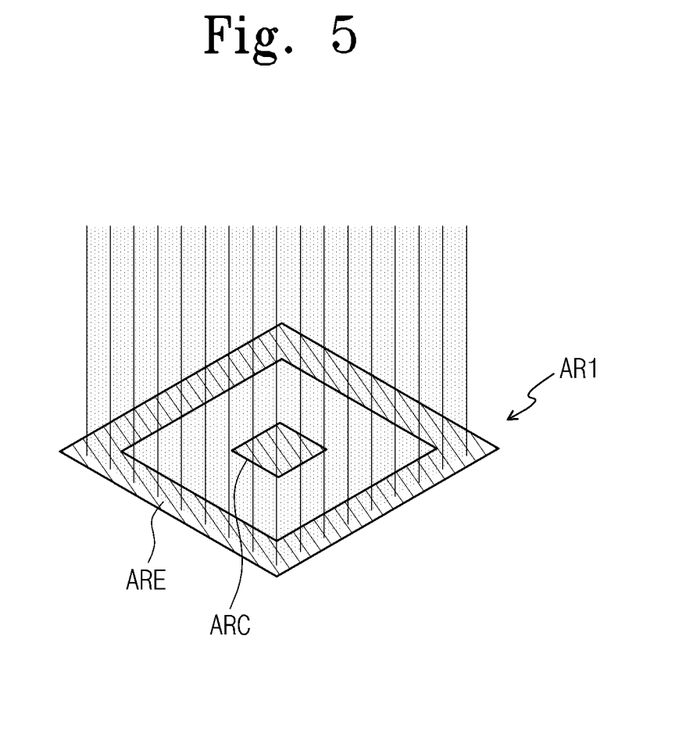
FIG. 5 is a view showing a processing area of a shadow mask shown in FIG. 1.

FIG. 5 is a view showing a processing area of a shadow mask shown in FIG. 1.

Referring to FIGS. 3 to 5, when the sub-laser beams are irradiated onto the processing area AR1, the heat is generated by the sub-laser beams. In this case, the heat generated from an edge ARE of the processing area ARI is discharged to the outside of the shadow mask SM, but the heat generated from a center ARC of the processing area AR1 is not discharged to the outside of the shadow mask SM.

The heat discharge sheet 400 makes contact with a lower portion of the shadow mask SM to absorb the heat generated from the edge ARE and the center ARC of the shadow mask SM and discharge the absorbed heat to the outside of the shadow mask SM.

The heat discharge sheet 400 is formed of a metal material having high heat conductivity, e.g., gold, silver, copper, aluminum, or an alloy thereof. Meanwhile, the heat discharge sheet 400 may have a single-layer structure or a multi-layer structure of the above-mentioned metals. In embodiments, the heat spreader sheet 400 may have a heat conductivity substantially higher than that of the mask material.

Referring to FIGS. 1, 3, and 4 again, the magnetic material 500 having a shape of plate is disposed under the heat discharge sheet 400. The plate having magnetic material 500 is accommodated in the frame 300 and disposed to correspond to the opening portion OP of the frame 300 when viewed in a thickness direction thereof. The magnetic material 500 is disposed on the stage 200 to support the heat discharge sheet 400. In other words, the magnetic material 500 is disposed to face the shadow mask SM while interposing the heat discharge sheet 400 therebetween.

The magnetic material 500 has a magnetism to generate an attractive force Fc with respect to the shadow mask SM. The shadow mask SM is attached to and fixed to the heat discharge sheet 400 by the attractive force Fc. In addition, due to the attractive force Fc, the shadow mask SM is tensioned to obtain a flatness for the patterning process.

The magnetic material 500 may include a ferromagnetic material to enhance the attractive force Fc generated between the shadow mask SM and the magnetic material 500, but the magnetic material 500 should not be limited to the ferromagnetic material. In other embodiments, the magnetic plate 500 can include a permanent magnet.

Figure 6:
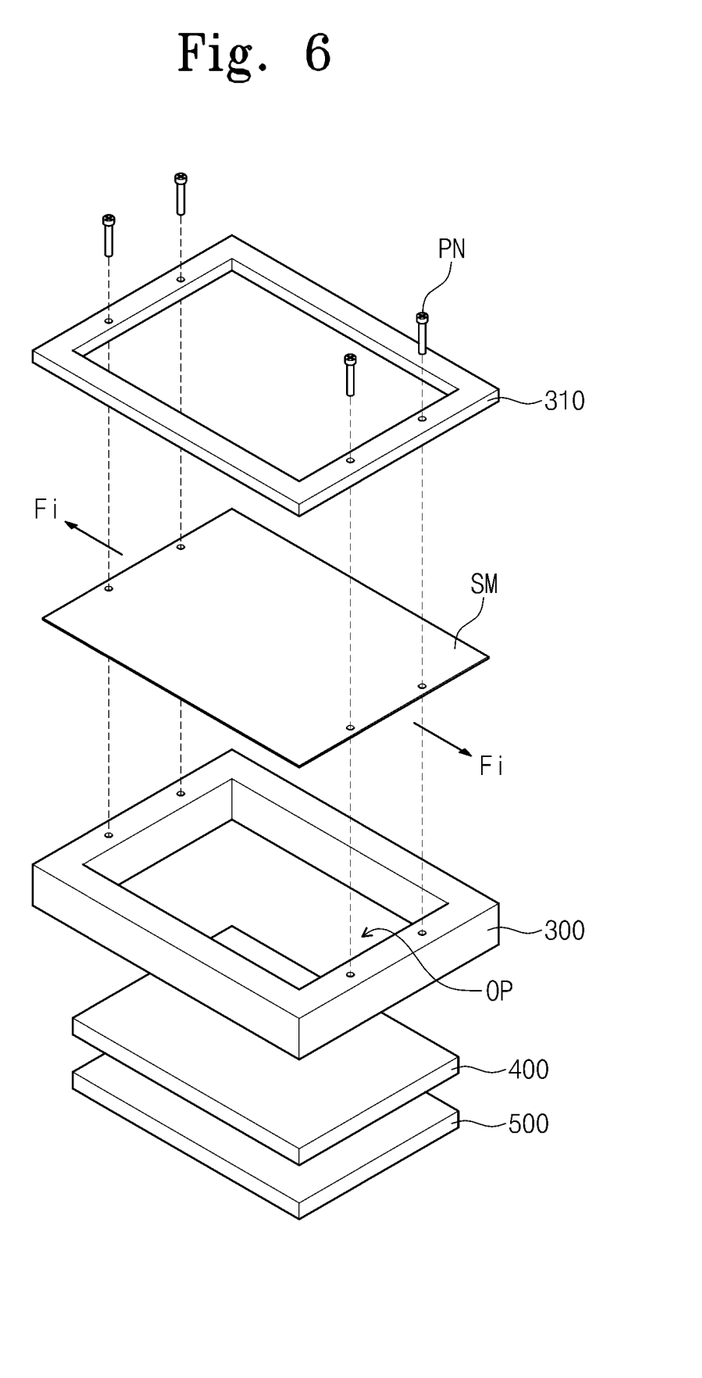
FIG. 6 is an exploded perspective view showing a shadow mask, an upper holder, a frame, a heat discharge sheet, and a magnetic material according to another exemplary embodiment of the present disclosure.

FIG. 6 is an exploded perspective view showing a shadow mask, an upper holder, a frame, a heat discharge sheet, and a magnetic material according to another exemplary embodiment of the present disclosure.

The mask manufacturing apparatus according to the present exemplary embodiment shown in FIG. 6 includes the same structure and function as those of the mask manufacturing apparatus shown in FIGS. 1 to 5 except for the upper holder. Accordingly, the upper holder 310 will be described in detail.

The mask manufacturing apparatus according to the present exemplary embodiment further includes the upper holder 310.

The upper holder 310 is disposed to face the frame 300 while interposing the shadow mask SM therebetween.

The upper holder 310 fixes the shadow mask SM to the frame 300 while the shadow mask SM is tensioned.

The upper holder 310 may have the same rectangular ring shape as the frame 300, but it should not be limited thereto or thereby. The upper holder 310 may have two bar shapes respectively corresponding to both sides of the shadow mask SM.

The upper holder 310, the shadow mask SM, and the frame 300 are screw-coupled to each other. In detail, after the shadow mask SM is tensioned by applying the attractive force Fi to the shadow mask SM, screws PN are engaged to the upper holder 319 and the frame 300 to penetrate through the shadow mask SM. One or more screws PN are engaged to both sides of the shadow mask SM, which face each other. In FIG. 6, two screws PN are engaged to each side of the shadow mask SM.

According to another embodiment, the shadow mask SM is firstly tensioned by the screw-coupling of the upper holder 310 and the frame 300, and then the shadow mask SM is tensioned again by the magnetic material 500. Thus, the shadow mask SM may be securely fixed to the frame 300 and obtain the flatness.

Figure 7:
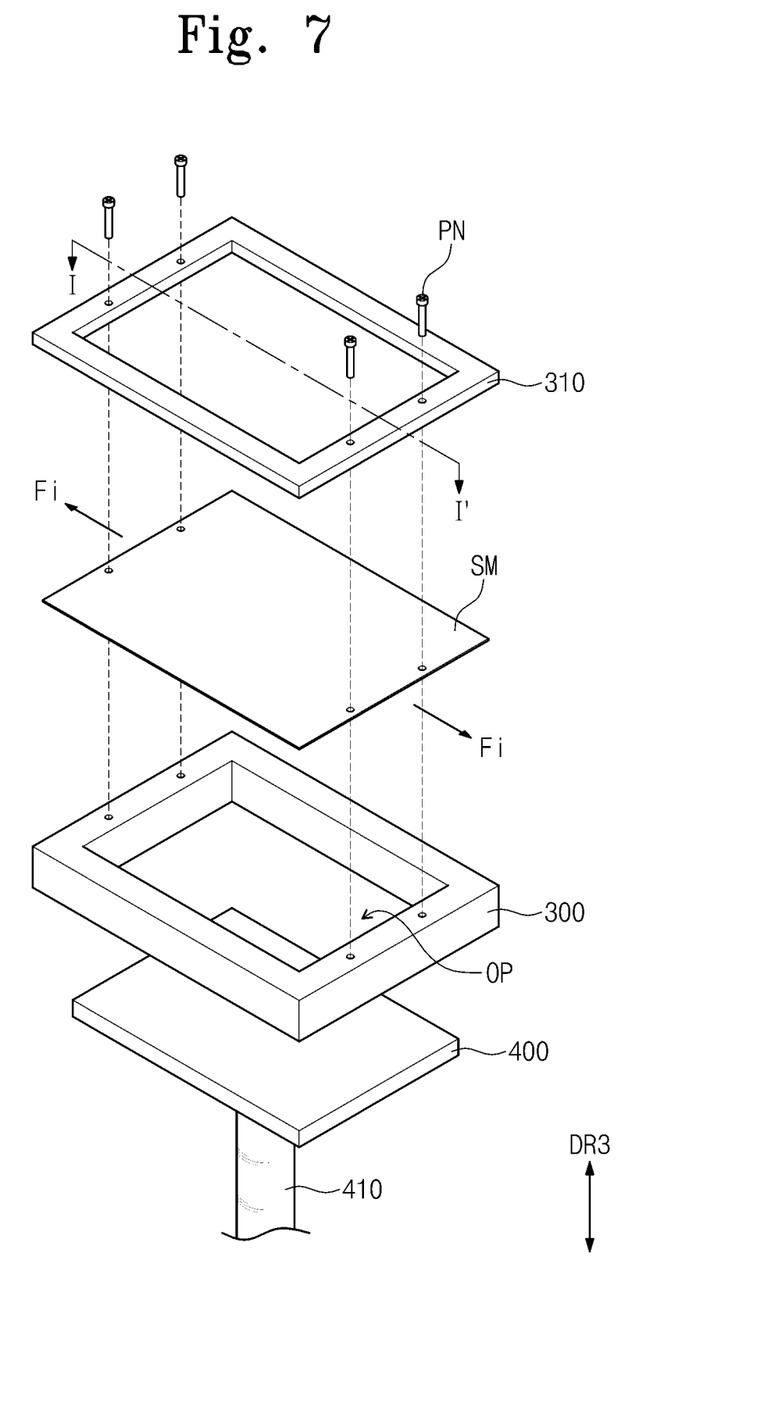
FIG. 7 is an exploded perspective view showing a shadow mask, an upper holder, a frame, a heat discharge sheet, and a heat-discharge sheet lift according to another exemplary embodiment of the present disclosure.
Figure 8:
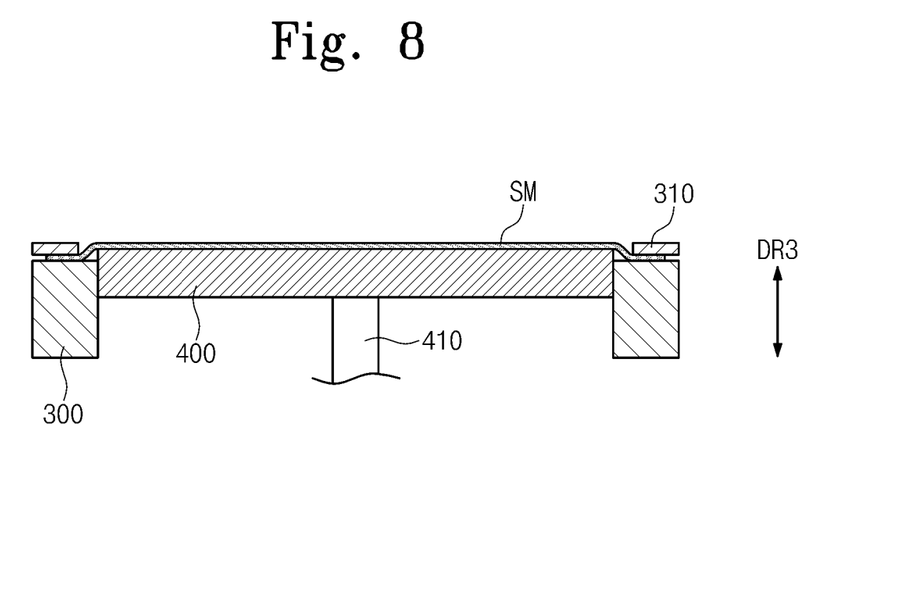
FIG. 8 is a cross-sectional view taken along a line I-I' of FIG. 7.

FIG. 7 is an exploded perspective view showing a shadow mask, an upper holder, a frame, a heat discharge sheet, and a heat-discharge sheet lift or raiser according to another exemplary embodiment of the present disclosure and FIG. 8 is a cross-sectional view taken along a line I-I' of FIG. 7.

The mask manufacturing apparatus according to the present exemplary embodiment shown in FIG. 7 further includes a heat-discharge sheet lift or pushing mechanism and the magnetic material is omitted as compared to the mask manufacturing apparatus shown in FIG. 6.

The mask manufacturing apparatus according to the present exemplary embodiment further includes the heat-discharge sheet lift 410.

The heat-discharge sheet pushing mechanism 410 is connected to the heat discharge sheet 400 to move the heat discharge sheet 400 to a third direction DR3 vertical to the surface of the heat discharge sheet 400. Although not shown in figures, the heat-discharge sheet lift or transfer mechanism 410 includes a transfer shaft connected to the lower portion of the heat discharge sheet 400 and a motor that rotates the transfer shaft.

The heat-discharge sheet transfer part or lift moves upward the heat discharge sheet 400 along the third direction DR3 to allow the heat discharge sheet 400 to make contact with the shadow mask SM. In addition, when the heat-discharge sheet transfer part 410 moves upward the heat discharge sheet 400, the shadow mask SM is tensioned to obtain the flatness for the patterning process.

In the mask manufacturing apparatus shown in FIG. 6, the shadow mask SM makes contact with the heat discharge sheet 400 by the attractive force generated between the magnetic material 500 and the shadow mask SM. However, although the mask manufacturing apparatus mechanically moves the heat discharge sheet 400 such that the heat discharge sheet 400 makes contact with the shadow mask SM as described with reference to FIGS. 7 and 8, the same tension effect and the same flatness of the shadow mask SM may be obtained as those of the shadow mask SM shown in FIG. 6.

Figure 9:
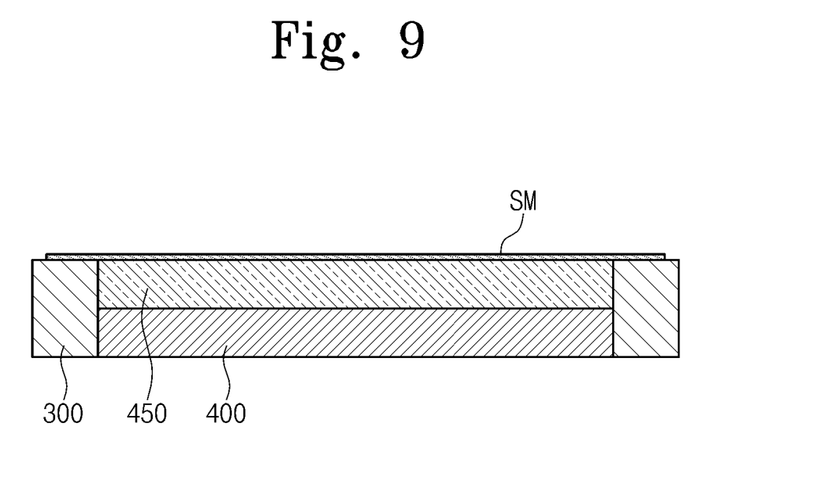
FIG. 9 is a cross-sectional view of a mask manufacturing apparatus according to another exemplary embodiment of the present disclosure.

FIG. 9 is a cross-sectional view a mask manufacturing apparatus according to another exemplary embodiment of the present disclosure.

The mask manufacturing apparatus according to the present exemplary embodiment shown in FIG. 9 further includes a heat transfer medium 450 and the magnetic material is omitted as compared to the mask manufacturing apparatus shown in FIGS. 1 to 4.

The mask manufacturing apparatus according to the present exemplary embodiment further includes the heat transfer medium 450.

The heat transfer medium 450 is accommodated in the frame 300 and disposed between the shadow mask SM and the heat discharge sheet 400. The heat transfer medium 450 has an adhesive property to be attached to the shadow mask SM and the heat discharge sheet 400.

The heat transfer medium 450 effectively transfers the heat generated from the shadow mask SM to the heat discharge sheet 400. In addition, the shadow mask SM is tensioned by an adhesive force between the heat transfer medium 450 and the shadow mask SM, which is caused by the adhesive property of the heat transfer medium 450, and thus the shadow mask SM may obtain the flatness for the patterning process.

The heat transfer medium 450 may be a thermowax or a thermal pad, but it should not be limited thereto or thereby. That is, the heat transfer medium 450 may be formed of various materials with high heat conductivity, adhesive property, etc. In embodiments, the heat transfer medium 450 may have a heat conductivity substantially higher than that of the mask material.

Figure 10:
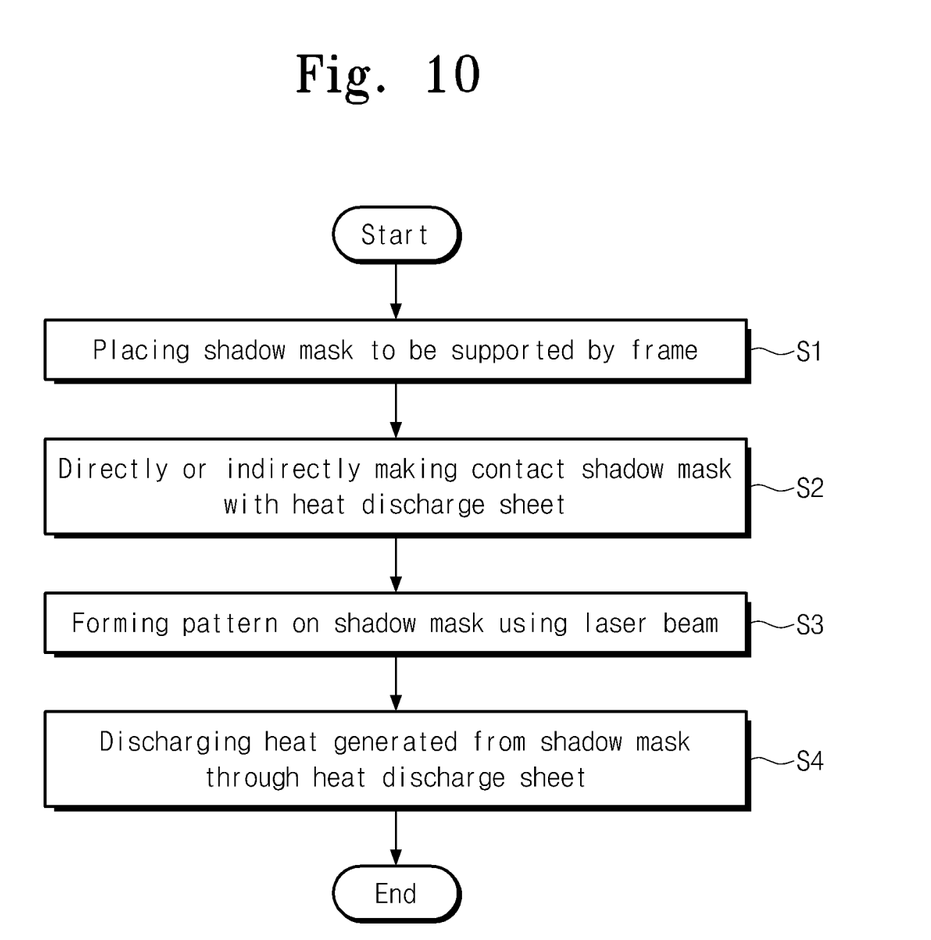
FIG. 10 is a flowchart showing a method of manufacturing a mask using a laser beam according to an exemplary embodiment of the present disclosure.

FIG. 10 is a flowchart showing a method of manufacturing a mask using a laser beam according to an exemplary embodiment of the present disclosure.

Referring to FIG. 10, the shadow mask, to be processed, is disposed on the frame to be supported by the frame (S1). In this case, the shadow mask is fixed to the frame using screws or clamping units, but it should not be limited thereto or thereby. That is, the shadow mask may be disposed on the frame such that only the edge of the shadow mask is supported by the frame.

Then, the shadow mask directly or indirectly makes contact with the heat discharge sheet (S2). The shadow mask may make contact with the heat discharge sheet by the following three methods.

First, as shown in FIGS. 3 and 4, the magnetic material 500 is disposed under the heat discharge sheet 400. The shadow mask SM directly makes contact with the heat discharge sheet 400 by the attractive force generated between the magnetic material 500 and the shadow mask SM. In addition, the shadow mask SM is tensioned by the attractive force and obtains the flatness to be patterned.

Second, as shown in FIGS. 7 and 8, by operating the heat-discharge transfer part 410, the heat discharge sheet 400 moves upward along the vertical direction which is perpendicular to the major surface of the heat discharge sheet 400. The heat discharge sheet 400 directly makes contact with the shadow mask SM after moving upward. In addition, the shadow mask SM is tensioned and obtains the flatness by the movement of the heat discharge sheet 400 using the heat-discharge transfer part 410.

Third, as shown in FIG. 9, the shadow mask SM and the heat discharge sheet 400 can make indirect heat conduction through the heat transfer medium 450 disposed between the shadow mask SM and the heat discharge sheet 400. The heat transfer medium 450 is formed of the thermowax or the thermal pad with the adhesive property and the high heat conductivity. In embodiments, the heat transfer medium 450 may have a heat conductivity substantially higher than that of the mask material.

Then, the pattern is formed on the shadow mask using the laser beam (S3). To this end, the laser beam is divided into the sub-laser beams using the DOE lens, and the sub-laser beams are irradiated onto the shadow mask.

After that, the heat generated from the shadow mask is discharged to the outside of the shadow mask through the heat discharge sheet (S4). The heat is generated from the shadow mask while the sub-laser beams are irradiated onto the shadow mask to form the pattern on the shadow mask. The heat generated from the shadow mask is discharged to the outside of the shadow mask through the heat discharge sheet that directly or indirectly makes contact with the shadow mask.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A mask manufacturing apparatus comprising:
a stage comprising a support surface;
a laser beam irradiator configured to irradiate a plurality of laser beams toward the support surface;
a frame disposed over the support surface of the stage and comprising a plurality of raised bars forming a closed loop, each of the raised bars comprising a frame surface facing away from the support surface; and
a heat spreader sheet placed over the support surface of the stage and comprising a heat spreader surface facing away from the support surface,
wherein the heat spreader surface contacts a surface of a shadow mask for absorbing heat generated during making the shadow mask with irradiation of the laser beams,
wherein the frame surface is raised relative to each of the heat spreader surface and another surface of the shadow mask facing away from the heat spreader surface.

2. The mask manufacturing apparatus of claim 1, wherein the laser beam irradiator comprises:
a laser beam generator configured to generate a laser beam;
a diffractive optical element (DOE) lens configured to divide the laser beam into the plurality of laser beams; and
a scanner configured to concentrate the plurality of laser beams and further configured to irradiate the plurality of laser beams.

3. The mask manufacturing apparatus of claim 2, wherein the laser beam irradiator further comprises an optical system configured to reduce an aberration between the plurality of laser beams.

4. The mask manufacturing apparatus of claim 1, wherein the heat spreader sheet comprises at least one selected from the group consisting of gold, silver, copper, aluminum, and an alloy thereof.

5. The mask manufacturing apparatus of claim 1, wherein the frame comprises the raised bars forming a rectangular shaped rim defining an opening.

6. The mask manufacturing apparatus of claim 5, wherein the heat spreader sheet is accommodated within the opening.

7. The mask manufacturing apparatus of claim 1, further comprising a magnetic material sheet accommodated in the frame, wherein the heat spreader sheet is interposed between the magnetic material sheet and the shadow mask when the shadow mask is placed over the stage.

8. The mask manufacturing apparatus of claim 1, further comprising a holder configured to be secured to the frame and further configured to hold the shadow mask when the holder is secured to the frame.

9. The mask manufacturing apparatus of claim 8, wherein the holder, the shadow mask, and the frame are coupled to each other by using screws.

10. The mask manufacturing apparatus of claim 8, further comprising a lift configured to move the heat spreader sheet in a vertical direction.

* * * * *